(12) United States Patent
Brodoceanu et al.

(10) Patent No.: US 10,910,514 B1
(45) Date of Patent: Feb. 2, 2021

(54) MOLDED ETCH MASKS

(71) Applicant: Facebook Technologies, LLC, Menlo Park, CA (US)

(72) Inventors: Daniel Brodoceanu, Cork (IE); David Massoubre, Cork (IE); Karsten Moh, Blieskastel (DE)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/229,966

(22) Filed: Dec. 21, 2018

Related U.S. Application Data

(60) Provisional application No. 62/742,006, filed on Oct. 5, 2018.

(51) Int. Cl.
| | |
|---|---|
| *H01L 33/24* | (2010.01) |
| *H01L 33/58* | (2010.01) |
| *H01L 33/32* | (2010.01) |
| *H01L 27/15* | (2006.01) |
| *H01S 5/12* | (2006.01) |
| *H01S 5/22* | (2006.01) |
| *H01L 33/00* | (2010.01) |
| *H01L 33/20* | (2010.01) |
| *G03F 7/00* | (2006.01) |
| *H01L 21/027* | (2006.01) |

(52) U.S. Cl.
CPC ........ *H01L 33/0095* (2013.01); *G03F 7/0005* (2013.01); *H01L 21/0273* (2013.01); *H01L 33/0075* (2013.01); *H01L 33/20* (2013.01); *H01L 33/32* (2013.01)

(58) Field of Classification Search
CPC ............ G02B 27/0075; G02B 27/0983; G02B 19/0066; G02B 27/22; G02B 19/0028; G02B 27/2271; G02B 17/002; H01L 27/156; H01L 25/0753; H05B 33/0803
See application file for complete search history.

(56) References Cited

U.S. PATENT DOCUMENTS

| | | | | |
|---|---|---|---|---|
| 2008/0210969 | A1* | 9/2008 | Yuan | H01L 33/40 257/98 |
| 2009/0050905 | A1* | 2/2009 | Abu-Ageel | H01L 33/20 257/80 |
| 2015/0236201 | A1* | 8/2015 | Shepherd | H01L 33/0075 257/88 |
| 2016/0365383 | A1* | 12/2016 | Shepherd | H01L 27/153 |
| 2018/0047872 | A1* | 2/2018 | Grundmann | H01L 33/145 |
| 2019/0019840 | A1* | 1/2019 | Thothadri | G02B 27/0075 |

* cited by examiner

*Primary Examiner* — Brian Turner
(74) *Attorney, Agent, or Firm* — Weaver Austin Villeneuve & Sampson LLP

(57) ABSTRACT

Techniques related to molded etch masks are disclosed. Etch masks can be formed based on pressing a mold against a layer of pliable masking material applied to a surface of an epitaxial layered structure. The epitaxial layered structure includes a first semiconductor layer, a second semiconductor layer, and a light-emitting layer between the first and second semiconductor layers. The epitaxial layered structure is etched using the molded etch masks to form etched structures. The etched structures may be optical structures that modify light emitted through the surface or epitaxial mesas that collimate light within the epitaxial layered structure.

18 Claims, 14 Drawing Sheets

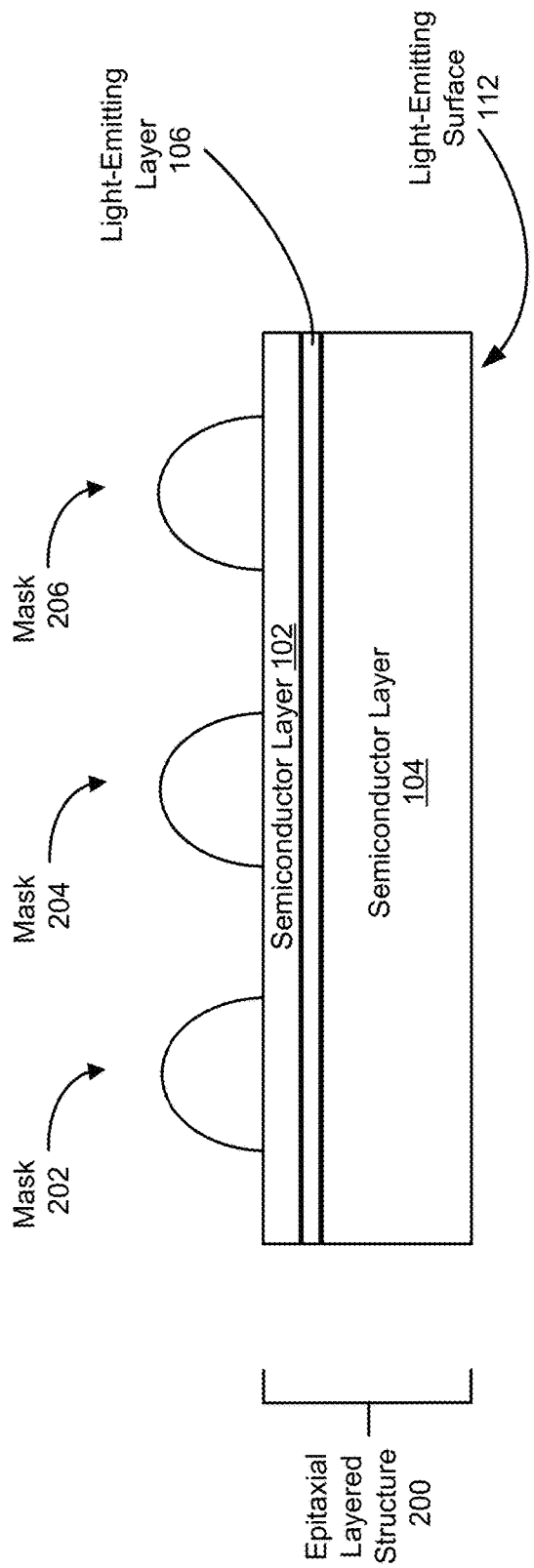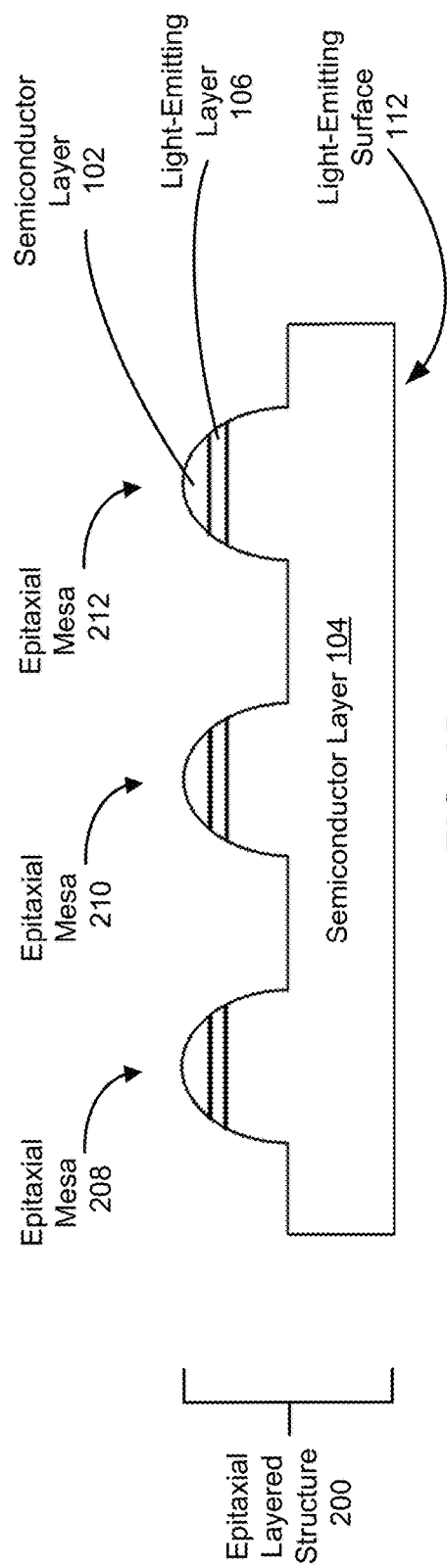

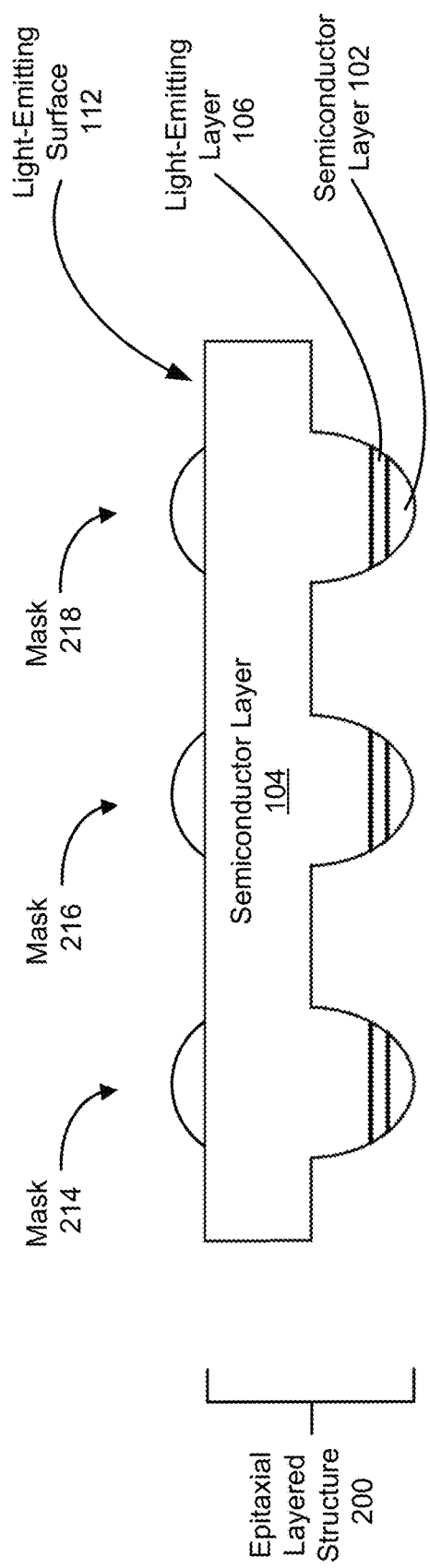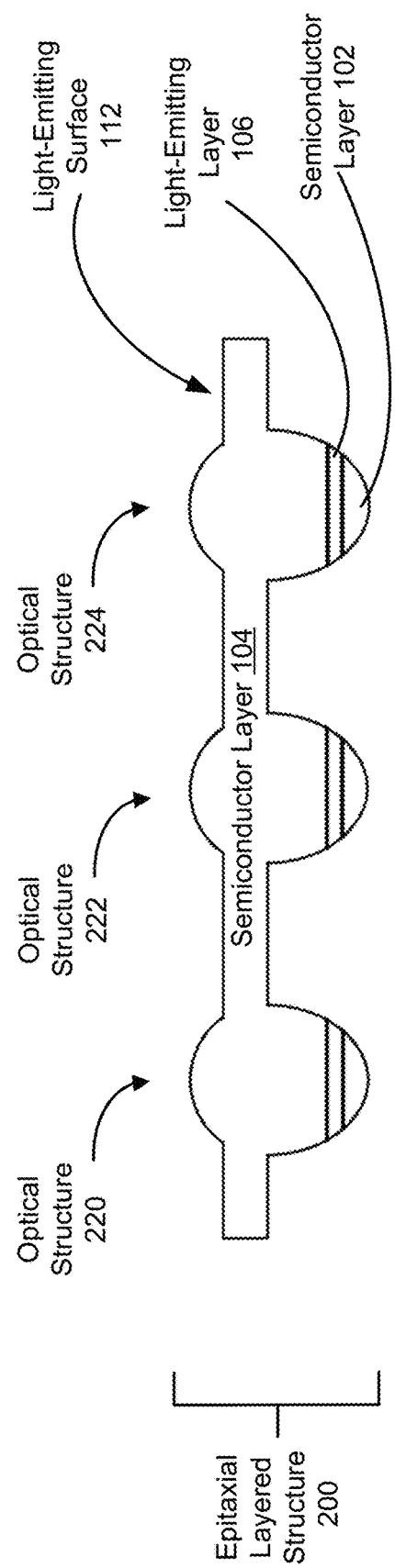

MOLDED ETCH MASKS

CROSS-REFERENCE TO RELATED APPLICATIONS

This application claims the benefit of U.S. Provisional Application No. 62/742,006, filed Oct. 5, 2018, entitled "Molded Etch Masks" which is incorporated herein by reference in its entirety.

BACKGROUND

The disclosure relates generally to semiconductor device fabrication, and more specifically to semiconductor device fabrication using molded etch masks.

Semiconductor devices have become prevalent in electronics for providing such benefits as reduced size, improved durability, and increased efficiency. For example, in contrast to an incandescent light bulb, a light-emitting diode (LED) is typically smaller, lasts several times longer, and converts proportionately more energy into light instead of heat. Furthermore, to increase light output in a desired direction, an LED may be shaped such that light emitted from the LED is collimated in the desired direction. As used herein, collimation and quasi-collimation are collectively referred to as "collimation".

Shaping LEDs may involve an etching process that uses masks to protect against one or more etchants. Such masks are referred to herein as "etch masks". In general, the etching process shapes LEDs by transferring the shapes of etch masks to the LEDs. However, conventional techniques for shaping etch masks involve thermally reflowing droplets of masking material into desired shapes. Thermal reflow is difficult to control, which makes it challenging to consistently fabricate LEDs having desired shapes in an efficient manner.

SUMMARY

This disclosure relates to one or more etch masks that are formed using a mold. In some embodiments, the one or more etch masks are used to form one or more optical structures for modifying light emitted from LEDs. Examples of such optical structures include, without limitation, a lens, a waveguide, and a diffraction grating. In some embodiments, the one or more etch masks are used to form one or more mesa-shaped structures for collimating light within LEDs. Examples of mesa shapes include, without limitation, a paraboloid, a cone, and a cylinder.

The one or more etch masks are formed based on pressing the mold against a layer of pliable masking material. Prior to pressing the mold against the masking material, the masking material is applied to a surface of an epitaxial layered structure. Thus, the one or more etch masks are formed on the surface of the epitaxial layered structure. The epitaxial layered structure includes a first semiconductor layer, a second semiconductor layer, and a light-emitting layer between the first and second semiconductor layers.

The one or more etch masks are used to etch the epitaxial layered structure, thereby forming one or more etched structures. The one or more etched structures may comprise one or more optical structures that modify light emitted from the surface of the epitaxial layered structure and/or one or more epitaxial mesas that collimate light within the epitaxial layered structure.

BRIEF DESCRIPTION OF THE DRAWINGS

Illustrative embodiments are described with reference to the following figures.

FIGS. 2A-D illustrate example approaches for etching semiconductor devices into desired shapes, in accordance with an embodiment.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

Disclosed herein are techniques that enable consistent and efficient fabrication of semiconductor devices (e.g., LEDs and/or photodiodes) having desired components. The desired components may include a structure for directionalizing light within a semiconductor device (e.g., a mesa-shaped structure) and/or a structure for directionalizing light transmitted through a surface of a semiconductor device (e.g., a lens, a waveguide, and/or a diffraction grating).

Semiconductor Devices

Figure 1:
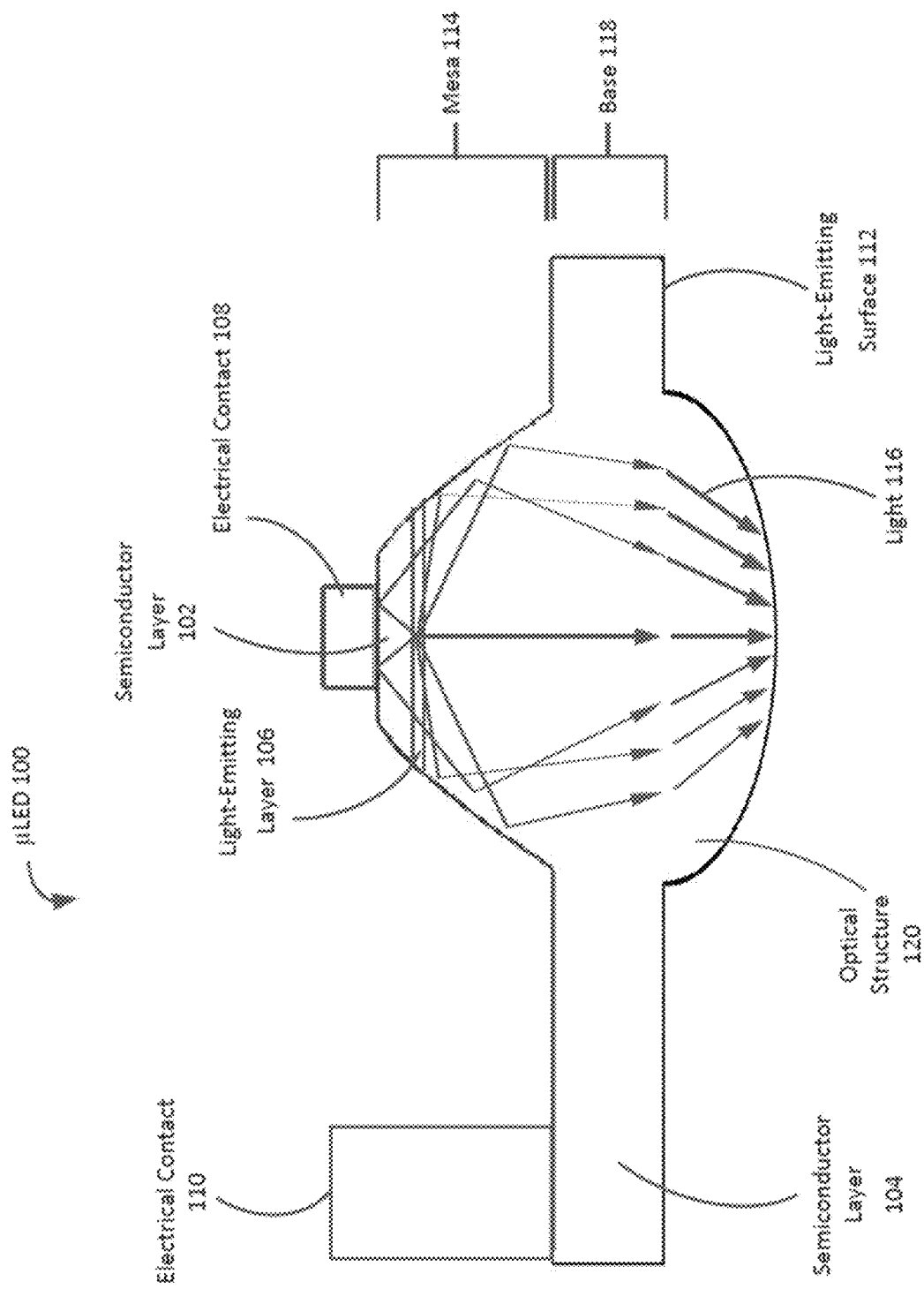
FIG. 1 illustrates an example semiconductor device, in accordance with an embodiment.

Referring to FIG. 1, a cross-sectional view of an example semiconductor device is provided. More specifically, the semiconductor device is an example of a microLED 100. As used herein, a microLED may refer to an LED that has an active light-emitting area with a linear dimension that is less than 50 µm, less than 20 µm, or less than 10 µm. The linear dimension may be as small as 2 µm or 4 µm. For example, their small size enables a display system to have a single pixel to have contributions from three such LEDs: a red micro LED, a green micro LED, and a blue micro LED. Their small size also enables micro LEDs to be lightweight, making them particularly suitable for use in wearable display systems, such as watches and computing glasses.

The microLED 100 includes, among other components, a semiconductor structure. The semiconductor structure comprises semiconductor layers 102 and 104 and a light-emitting layer 106 that sits between the semiconductor layers 102 and 104. For example, the microLED 100 may be an inorganic LED in which the light-emitting layer 106 is a layer of indium gallium nitride that is situated between a layer of p-type gallium nitride and a layer of n-type gallium nitride. In some embodiments, semiconductor layer 102 is a p-type semiconductor, and semiconductor layer 104 is an n-type semiconductor. In some embodiments, semiconductor layer 102 is an n-type semiconductor, and semiconductor layer 104 is a p-type semiconductor. The semiconductor structure may comprise an epitaxial layered structure, which is described in greater detail in the next section.

The semiconductor layers 102 and 104 are operatively coupled to electrical contacts 108 and 110, respectively. The electrical contacts 108 and 110 are typically made of a conductive material, such as a metallic material. In the example of FIG. 1, the electrical contacts 108 and 110 are both located on a surface of the semiconductor structure opposite to a light-emitting surface 112. Thus, the electrical contacts 108 and 110 can support the microLED 100 when it is mounted on a substrate that includes a control circuit. However, in some embodiments, electrical contacts can be located on opposite surfaces of a semiconductor structure.

The light-emitting layer 106 includes one or more quantum wells that output light 116 when a voltage is applied across the electrical contacts 108 and 110. To directionalize the output of light 116, the semiconductor structure may be formed into any of a variety of shapes, such as a paraboloid, a cylinder, or a cone. Such shapes are referred to herein as "mesa" shapes.

In the example of FIG. 1, mesa 114 corresponds to a paraboloid shape that guides light 116 toward the light-emitting surface 112 of the semiconductor structure. More specifically, the light-emitting layer 106 is approximately positioned at the focal point of the paraboloid such that some of the emitted light is reflected, within a critical angle of total internal reflection, off the inner walls of the paraboloid toward the light-emitting surface 112.

In some embodiments, a mesa shape also has a truncated top that can accommodate an electrical contact. In the example of FIG. 1, mesa 114 corresponds to a paraboloid shape having a truncated vertex that accommodates electrical contact 108. Base 118 refers to the part of the semiconductor structure that is not included in the mesa 114.

In some embodiments, an optical structure 120 can be formed on the light-emitting surface 112. In the example of FIG. 1, the optical structure 120 is a microlens that enables further collimation of light 116. However, other example optical structures include, without limitation, waveguides or diffraction gratings.

The microLED 100 may include other components, such as a dielectric layer, a reflective layer, etc. However, to avoid unnecessarily obscuring the disclosure, such components are not illustrated in FIG. 1.

Etching Processes

As mentioned above, semiconductor devices can be fabricated to have desired shapes and components based on an etching process. The etching process may involve one or more etching techniques, such as dry etching, wet etching, or combinations thereof. Etching is typically performed using a mask to control how a semiconductor device is shaped.

For example, FIGS. 2A-B illustrate a dry etching process that forms an array of epitaxial mesas 208-212 using an array of similarly shaped masks 202-206. In some embodiments, the epitaxial mesas 208-212 have the same shapes as the masks 202-206. In other embodiments, the epitaxial mesas 208-212 have shapes that are related to those of the masks 202-206 by a particular function (e.g., a transfer function that produces a particular epitaxial mesa shape given a particular mask shape). Although FIGS. 2A-B illustrate three semiconductor devices formed using three masks, it should be appreciated that the process illustrated in FIGS. 2A-B can be used to concurrently form any number of semiconductor devices using any number of masks, including one semiconductor device formed using one mask.

Referring to FIG. 2A, the masks 202-206 are positioned on an epitaxial layered structure 200, which comprises the semiconductor layers 102 and 104 and the light-emitting layer 106 illustrated in FIG. 1. More specifically, the masks 202-206 are positioned on a surface opposite to what is to be the light-emitting surface 112 of the epitaxial layered structure 200. For the sake of clarity and ease of explanation, a surface that is to be the light-emitting surface 112 is hereinafter simply referred to as a "light-emitting surface".

The epitaxial layered structure 200 may be grown using techniques such as Molecular Beam Epitaxy (MBE) or Metalorganic Chemical Vapor Deposition (MOCVD). In some embodiments, the epitaxial layered structure 200 is formed by growing the layers sequentially. Thus, the semiconductor layer 104 may be grown on a fabrication substrate (not shown). Fabrication substrates are described in greater detail below with reference to FIG. 8. Thereafter, the light-emitting layer 106 may be grown on the semiconductor layer 104, and the semiconductor layer 102 may be grown on the light-emitting layer 106. In some embodiments, one or more other layers, such as a p++ semiconductor layer, may also be grown.

After positioning the masks 202-206, the epitaxial layered structure 200 may be subjected to an etching process involving a dry etching technique. Examples of dry etching techniques include, without limitation, Radio Frequency (RF) oxygen plasma etching, reactive ion etching (ME), and/or inductively coupled plasma (ICP) etching.

The masks 202-206 serve as shields that protect some parts of the underlying epitaxial layered structure 200. In some embodiments, the masks 202-206 are eroded during the dry etching process. For example, an anisotropic/quasi-anisotropic ICP etch may involve accelerating Argon ions downward such that the epitaxial layered structure 200 and the masks 202-206 of FIG. 2A are eroded, thereby forming the epitaxial mesas 208-212 of FIG. 2B. The amount of protection offered by a mask may depend on the thickness of the mask. Thus, the shapes of masks may determine the shapes of epitaxial mesas formed during an etching process.

Although the epitaxial mesas 208-212 of FIG. 2B are illustrated without truncated tops, in some embodiments, the mesa shape(s) formed out of an epitaxial layered structure can have truncated tops. Truncation may be performed during or separately from a particular etching process. For example, the aforementioned etching process may involve masks having truncated tops. As another example, the aforementioned etching process may be part of a multi-stage etching process in which truncation is performed as a separate etching process. As yet another example, truncation may be performed as a separate non-etching process, such as a laser ablation process.

A similar etching process can be used to form optical structures, such as a convex lens, a concave lens, a flat lens, a Fresnel lens, a waveguide, and/or a diffraction grating. For example, FIGS. 2C-D illustrate a dry etching process that forms an array of optical structures 220-224 using an array of similarly shaped masks 214-218. In some embodiments, the optical structures 220-224 have the same shapes as the masks 214-218. In other embodiments, the optical structures 220-224 have shapes that are related to those of the masks 214-218 by a particular function (e.g., a transfer function that produces a particular epitaxial mesa shape given a particular mask shape).

Although FIGS. 2C-D illustrate three optical structures formed using three masks, it should be appreciated that the process illustrated in FIGS. 2C-D can be used to concurrently form any number of optical structures using any number of masks, including one optical structure formed using one mask. Furthermore, although FIGS. 2C-D illustrate the formation of optical structures on an epitaxial layered structure having epitaxial mesas, it should be appreciated that the process illustrated in FIGS. 2C-D is equally applicable to an epitaxial layered structure not having epitaxial mesas.

Referring to FIG. 2C, the masks 214-218 are positioned on what is to be the light-emitting surface 112 of the epitaxial layered structure 200. The light-emitting surface 112 is opposite to the surface on which epitaxial mesas have been formed. In some embodiments, the epitaxial layered structure 200 is then subjected to an etching process involving a dry etching technique, such as ICP etching. The masks 214-218 serve as shields that protect some parts of the underlying epitaxial layered structure 200.

In some embodiments, the dry etching process erodes the masks 214-218 along with unprotected parts of the epitaxial layered structure 200, thereby forming the optical structures 220-224 of FIG. 2D. Thus, the shapes of the optical structures 220-224 may be determined by the shapes of the masks 214-218 used in the etching process.

Mask Formation

Figure 3A:
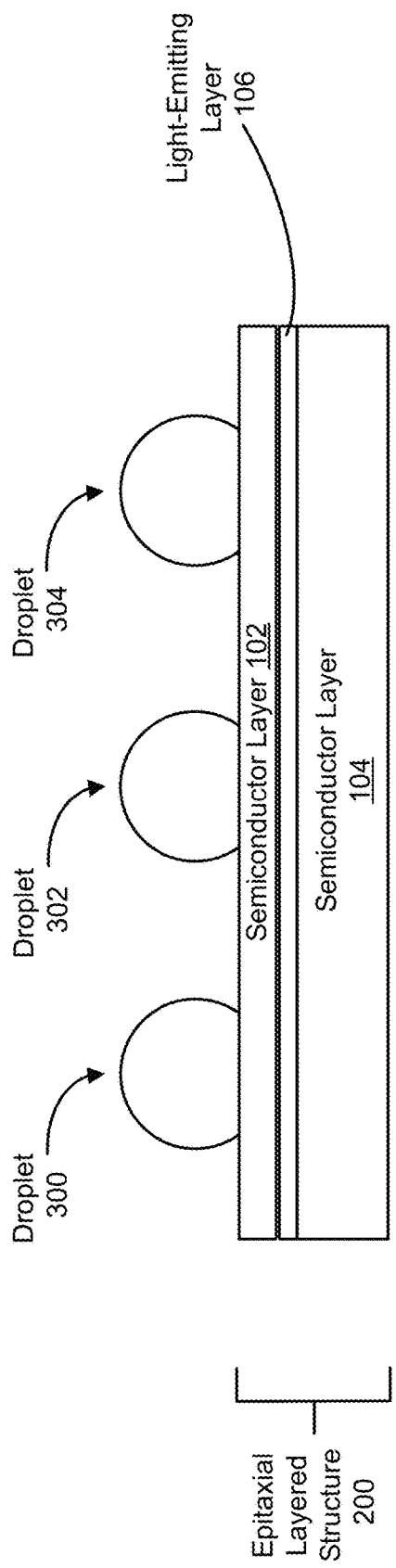
FIGS. 3A-B illustrate an example approach for shaping masks based on a thermal reflow technique, in accordance with an embodiment.
Figure 3B:
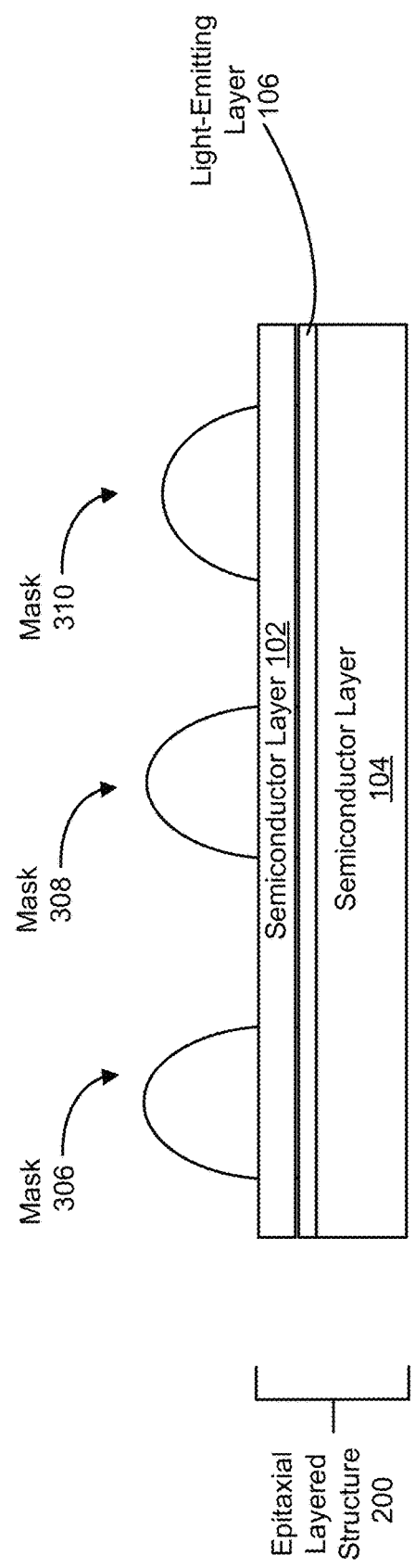

As mentioned above, the shapes of semiconductor device components can be determined by the shapes of etch masks. However, consistently and efficiently forming etch masks in desired shapes can be challenging. Conventionally, etch masks are shaped based on thermally reflowing droplets of masking material. FIGS. 3A-B illustrate an example thermal reflow process that forms masks 306-310. Although FIGS. 3A-B illustrate thermal reflow in the context of forming epitaxial mesas, it should be appreciated that thermal reflow can also be used in the context of forming lenses or other optical structures.

Referring to FIG. 3A, droplets 300-304 of masking material are applied to an epitaxial layered structure 200. The masking material may be any of a variety of pliable materials including, without limitation, an elastomer, a photocurable polymer, and/or a photoresist material.

Thermally treating the droplets 300-304 causes them to soften or reflow into a different shape, such as a mesa shape. However, thermal reflow is difficult to control. As a result, etch masks produced using this technique may exhibit inconsistencies from one mask to another. For example, FIG. 3B illustrates masks 306-310 that are significantly different from each other. As illustrated by masks 306-310, thermal reflow can result in shifted mask locations and/or non-uniform mask shapes.

Furthermore, minimizing inconsistencies can be time-consuming depending on what is determined to be an acceptable level of deviation from a desired shape. For example, additional time may be spent adjusting the shapes of the masks 306-310 to increase conformity with a desired mesa shape.

Figure 4A:
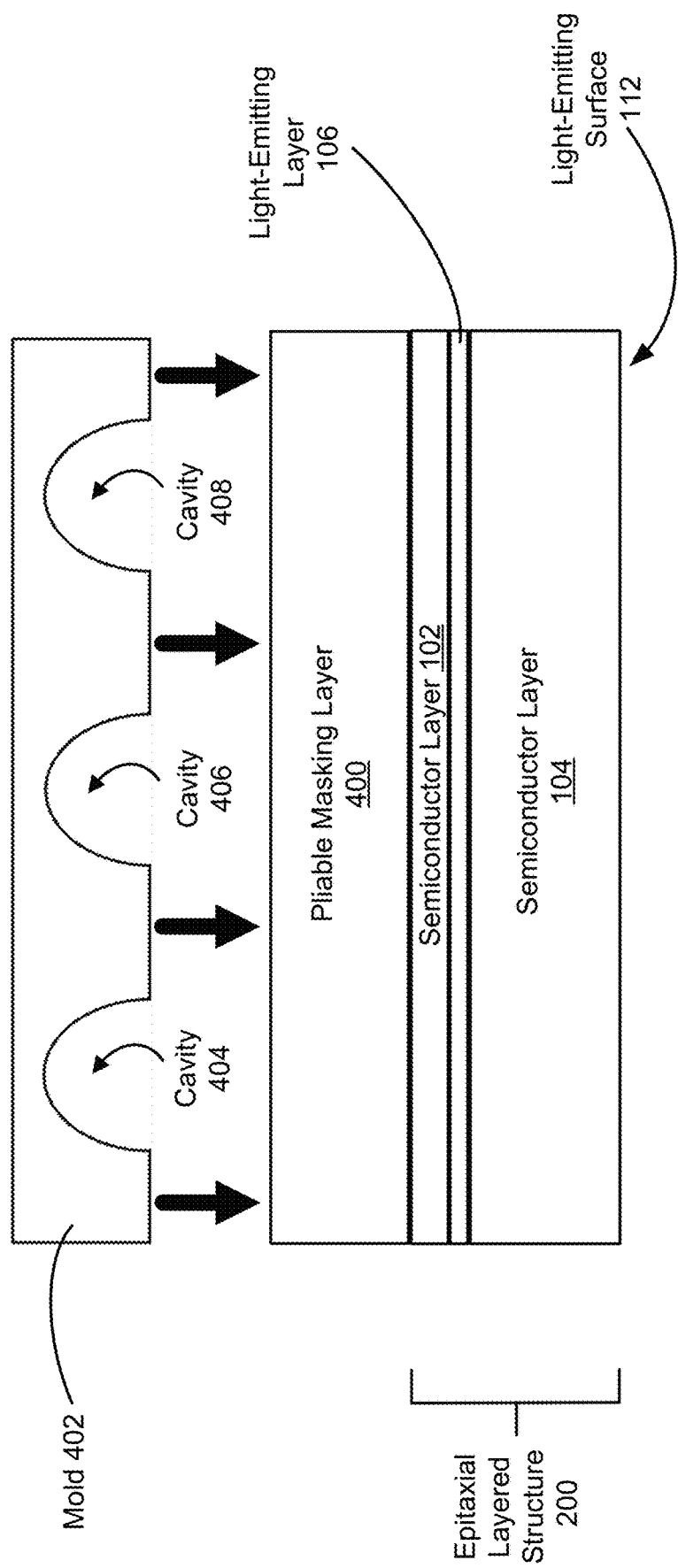
FIGS. 4A-B illustrate example techniques related to molding masks, in accordance with an embodiment.
Figure 4B:
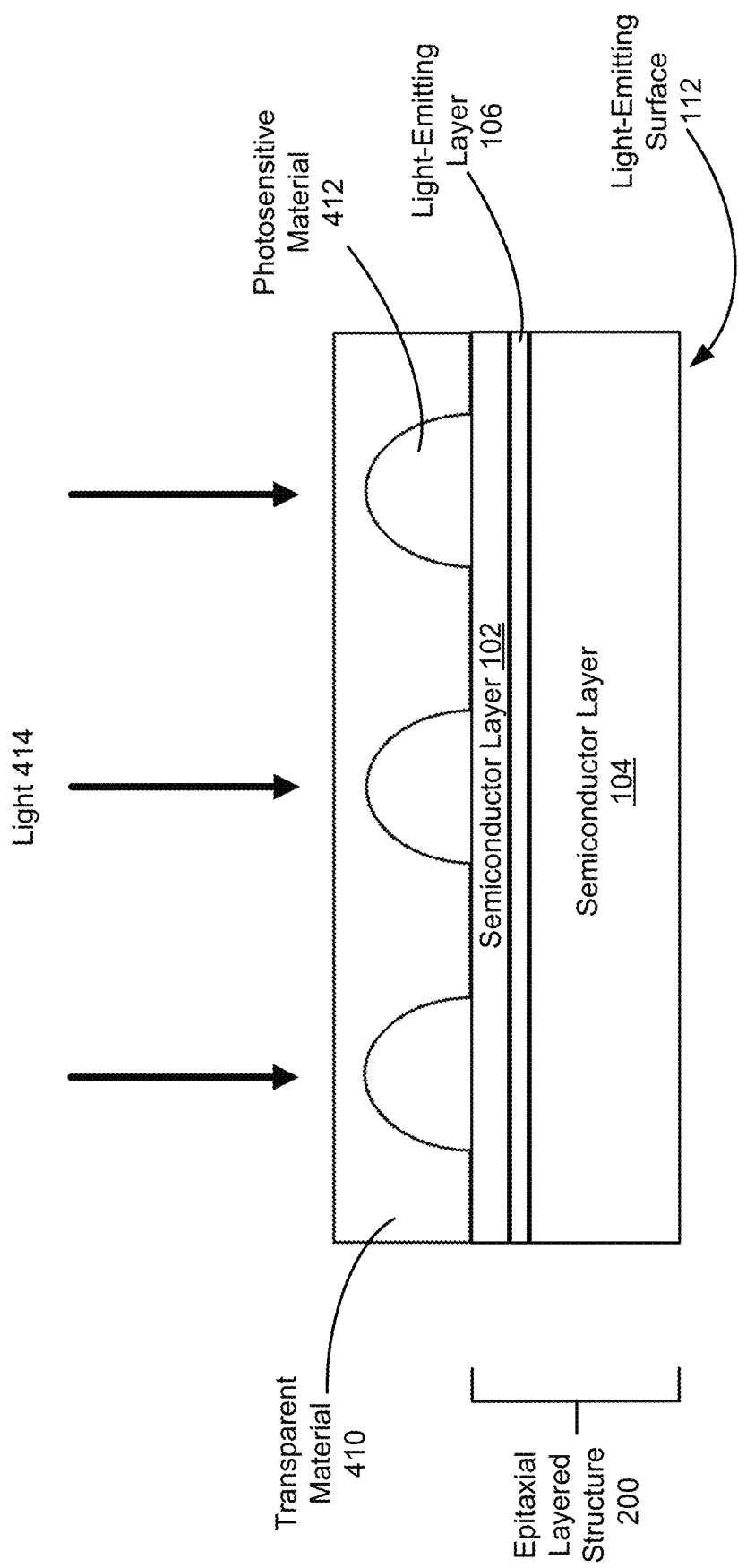

To avoid the aforementioned drawbacks of the thermal reflow technique, etch masks may instead be molded into desired shapes. FIGS. 4A-B illustrate example techniques related to molding an array of masks, such as the masks illustrated in FIG. 2A. Although FIGS. 4A-B illustrate the formation of three masks, it should be appreciated that the process illustrated in FIGS. 4A-B can be used to concurrently form any number of masks, even a single mask. Furthermore, although FIGS. 4A-B illustrate the formation of an array of uniform masks, in some embodiments, different masks in the array can be molded into different desired shapes.

Referring to FIG. 4A, a pliable masking layer 400 is applied to a surface of an epitaxial layered structure 200. In the example of FIG. 4A, the pliable masking layer 400 is applied to a surface opposite to the light-emitting surface 112 to form epitaxial mesas. However, in some embodiments, the pliable masking layer 400 is applied to the light-emitting surface 112 to form a lens or some other optical element.

The masks are formed based on pressing a mold 402 against the pliable masking layer 400. The mold 402 can be made of any of a variety of materials that have superior structural integrity relative to the pliable masking layer 400. The mold 402 has cavities 404-408 that each have a desired shape. In the example of FIG. 4A, each cavity has a "negative" image of a mesa shape. Thus, when the mold 402 is pressed against the pliable masking layer 400, each cavity forms a "positive" image of the mesa shape in the masking material. As used herein, a negative image refers to an image that is inverted/recessed/debossed relative to its environment, whereas a positive image refers to an image that is raised/embossed relative to its environment. Excess masking material may be displaced by the mold 402 from the surface of the epitaxial layered structure 200 and/or otherwise removed.

FIG. 4A illustrates mesa shapes without truncated tops. However, in some embodiments, mesa shapes with truncated tops are formed when a mold is pressed against a pliable masking layer. In such embodiments, the mold has one or more cavities that each have a negative image of a mesa shape with a truncated top.

In general, relatively hard masks are more effective at protecting underlying semiconductor layer(s) than relatively soft masks. However, it is difficult to form masks based on pressing a mold against a hard material. Thus, in some embodiments, the masking material may change its state from a soft, pliable material to a hard, non-pliable material. As used herein, this state-changing process is referred to as "curing" the state-changing material.

FIG. 4B illustrates an example curing process that may be performed when the mold 402 is pressed against the pliable masking layer 400 of FIG. 4A. However, it should be appreciated that any of a variety of curing techniques may be used. For example, thermal curing may instead be used to perform a curing process.

Referring to FIG. 4B, the mold 402 is made of a transparent material 410, and the pliable masking layer 400 is made of a photosensitive material 412. Thus, a light 414 may be transmitted through the transparent material 410 of the mold 402 such that one or more masks are exposed to the light 414 and thereby cured. As used herein, the modifier "transparent" refers to the quality of being transparent or quasi-transparent (e.g., enabling light to pass through albeit with some refraction).

The light 414 may have a wavelength that falls within any of a variety of wavelength ranges for curing the photosensitive material 412. For example, the light 414 may have a wavelength that falls within the ultraviolet range of the electromagnetic spectrum.

Examples of the transparent material 410 include, without limitation, glass and polydimethylsiloxane (PDMS). However, the particular transparent material used may vary from implementation to implementation and may be determined, at least in part, by one or more other materials used to fabricate the mold. For example, the one or more other materials may include a hard material against which the mold is formed. In other words, the mold may, in turn, be molded using the hard material. Examples of the hard material include, without limitation, fused silica, sapphire, or a photoresist material cured using a 2-photon polymerization (2PP) printer. The particular hard material used may vary from implementation to implementation so long as the transparent material 410 can be separated from the hard material.

In some embodiments, one or more positive images of a desired shape (e.g., a mesa shape or a lens shape) may be formed out of the hard material prior to forming a mold, such as the mold 402. The one or more positive images may be formed based on an etching process (e.g., ion milling), a high-resolution three-dimensional printing process (e.g., a 2PP printing process), and/or any other suitable process. Thereafter, the mold (e.g., mold 402) may be formed against the one or more positive images of the hard material. For example, PDMS may be poured over mesa shapes formed out of fused silica such that the PDMS is molded against the fused silica upon curing.

Figure 5A:
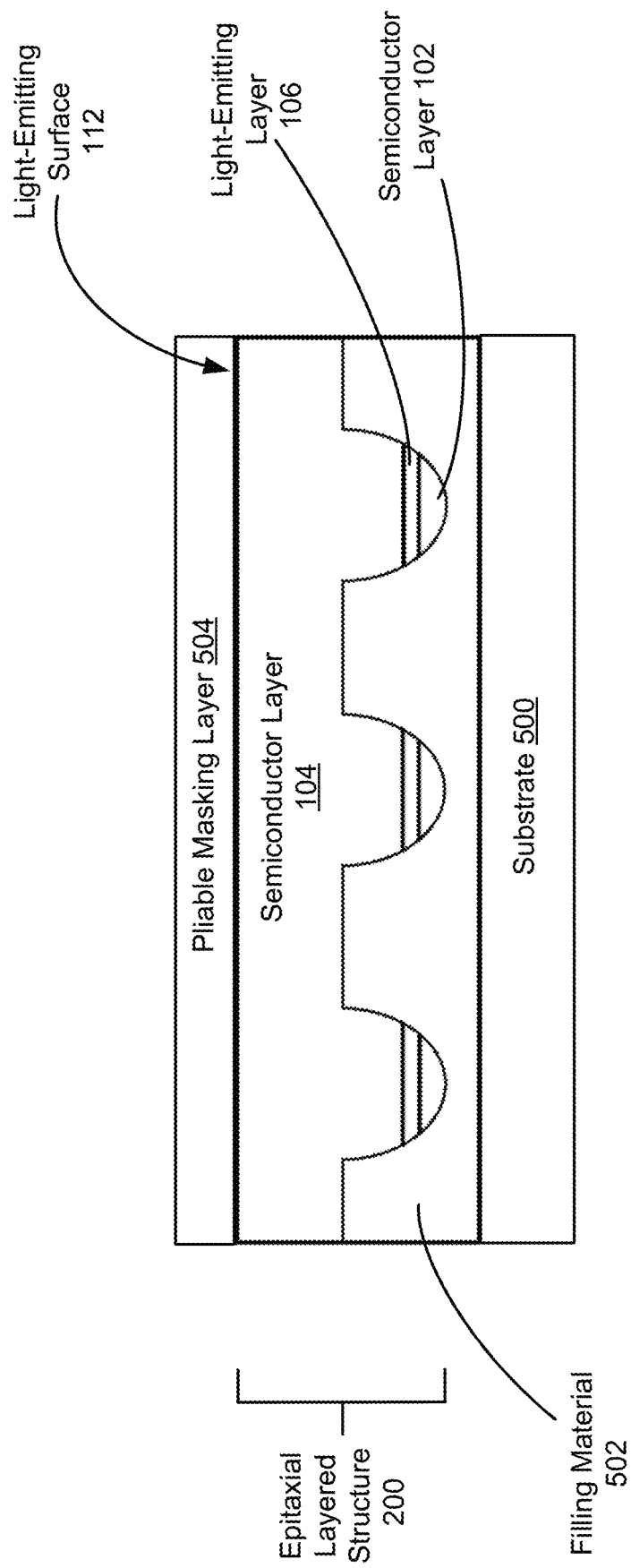
FIGS. 5A-C illustrate an example approach for molding masks on a light-emitting surface of a semiconductor device, in accordance with an embodiment.
Figure 5B:
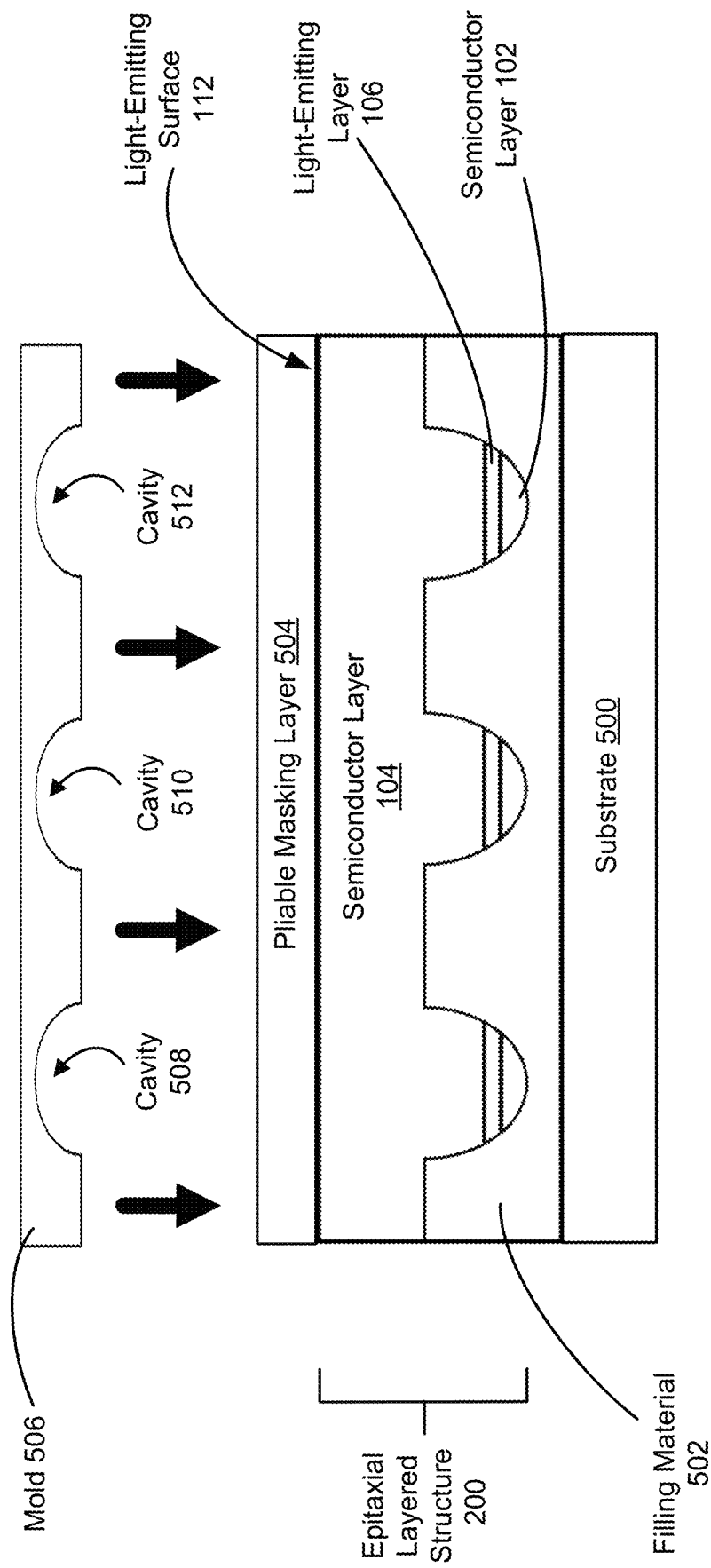
Figure 5C:
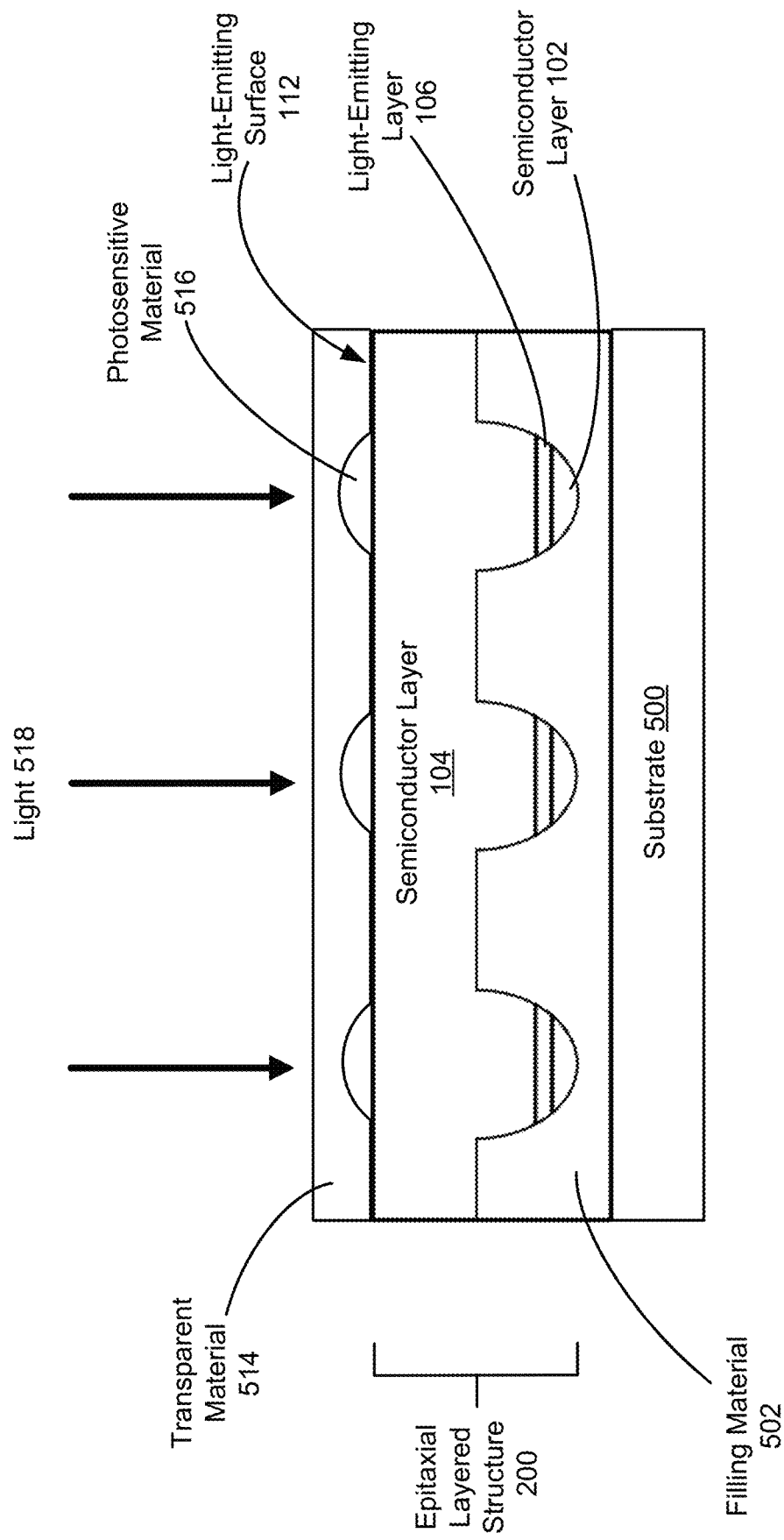

As mentioned above, the example techniques illustrated in FIGS. 4A-B can be used to form masks on the light-emitting surface 112 or the opposite surface. However, in some embodiments, masks are formed on both the light-emitting surface 112 and the opposite surface. For example, FIGS. 5A-C illustrate an example process for molding masks (e.g., the masks illustrated in FIG. 2C) on the light-emitting surface 112 after masks (e.g., the masks illustrated in FIG. 2A) have been molded and used to etch mesas on the opposite surface. Although FIGS. 5A-C illustrate the formation of three masks, it should be appreciated that the process illustrated in FIGS. 5A-C can be used to concurrently form any number of masks, even a single mask. Furthermore, although FIGS. 5A-C illustrate the formation of an array of uniform masks, in some embodiments, different masks in the array can be molded into different desired shapes.

FIG. 5A illustrates the epitaxial layered structure of FIG. 2B embedded in a filling material 502 and mounted on a substrate 500. The filling material 502 may serve to provide stability and protect the epitaxial mesas etched in the epitaxial layered structure 200. Examples of the filling material 502 include, without limitation, polyvinyl alcohol, polyvinyl acetate, polyester, polymethyl methacrylate, polystyrene, polycarbonate, or polyvinyl butyral.

The substrate 500 may be composed of any of a variety of materials including, without limitation, glass or fused silica. In some embodiments, the substrate 500 is composed of a transparent material such that the epitaxial layered structure 200 can be exposed to light transmitted through the substrate 500.

In the example of FIG. 5A, the epitaxial layered structure 200 is etched, flipped over, and mounted on the substrate 500. Thus, the substrate 500 is a different substrate (e.g., a carrier substrate) from a substrate (i.e., a growth substrate) on which the epitaxial layered structure 200 is grown. Example materials for the growth substrate include, without limitation, glass; sapphire; and semiconductor materials, such as gallium arsenide, gallium nitride, gallium phosphide, and silicon. The growth substrate can be separated from the light-emitting surface 112 using any of a variety of techniques including, without limitation, laser lift-off or wet etching.

Thereafter, a pliable masking layer 504 may be applied to the light-emitting surface 112. The pliable masking layer 504 may have properties that are similar or identical to those of the pliable masking layer 400 of FIG. 4A.

FIG. 5B illustrates a mold 506 for forming masks out of the pliable masking layer 504. The mold 506 may share many similarities with the mold 402 of FIG. 4A. For example, the mold 506 and the mold 402 may have similar/identical properties and/or may be fabricated using the same/similar process.

In the example of FIG. 5B, the mold 506 has cavities 508-512 that each have a negative image of an optical element, such as a lens. Thus, when the mold 506 is pressed against the pliable masking layer 504, each cavity forms a positive image of the optical element in the masking material. Excess masking material may be displaced by the mold 506 from the surface of the epitaxial layered structure 200 and/or otherwise removed.

In some embodiments, a microscope is used to align the centers of the cavities 508-512 with the centers of the epitaxial mesas. Any of a variety of microscopy techniques may be used including, without limitation, fluorescence microscopy, transmitted light microscopy, bright field microscopy, and/or dark field microscopy. For example, the epitaxial layered structure 200 may be irradiated with ultraviolet light, which causes the light-emitting layer 106 of each epitaxial mesa to fluoresce, and the centers of the fluorescent emissions may be aligned with the centers of the cavities 508-512. The epitaxial layered structure 200 may be exposed to ultraviolet light through the substrate 500 or through the light-emitting surface 112 during alignment of the centers of the cavities 508-512 with the centers of the epitaxial mesas.

FIG. 5C illustrates an example curing process that may be performed when the mold 506 is pressed against the pliable masking layer 504 of FIG. 5B. Referring to FIG. 5C, the mold 506 is made of a transparent material 514, and the pliable masking layer 504 is made of a photosensitive material 516. Thus, a light 518 may be transmitted through the transparent material 514 of the mold 506 such that one or more masks are exposed to the light 518 and thereby cured.

The example of FIG. 5C may be similar to the example of FIG. 4B in many respects. For example, the transparent material 514, the photosensitive material 516, and/or the light 518 of FIG. 5C may have properties that are similar or identical to those of the transparent material 410, the photosensitive material 412, and/or the light 414 of FIG. 4B.

In some embodiments, etching the epitaxial layered structure 200 is part of a process for dividing the epitaxial layered structure 200 into sets of one or more semiconductor devices. For example, FIGS. 6A-C illustrate a process for singulating LED devices that involves etching the epitaxial layered structure 200.

Figure 6A:
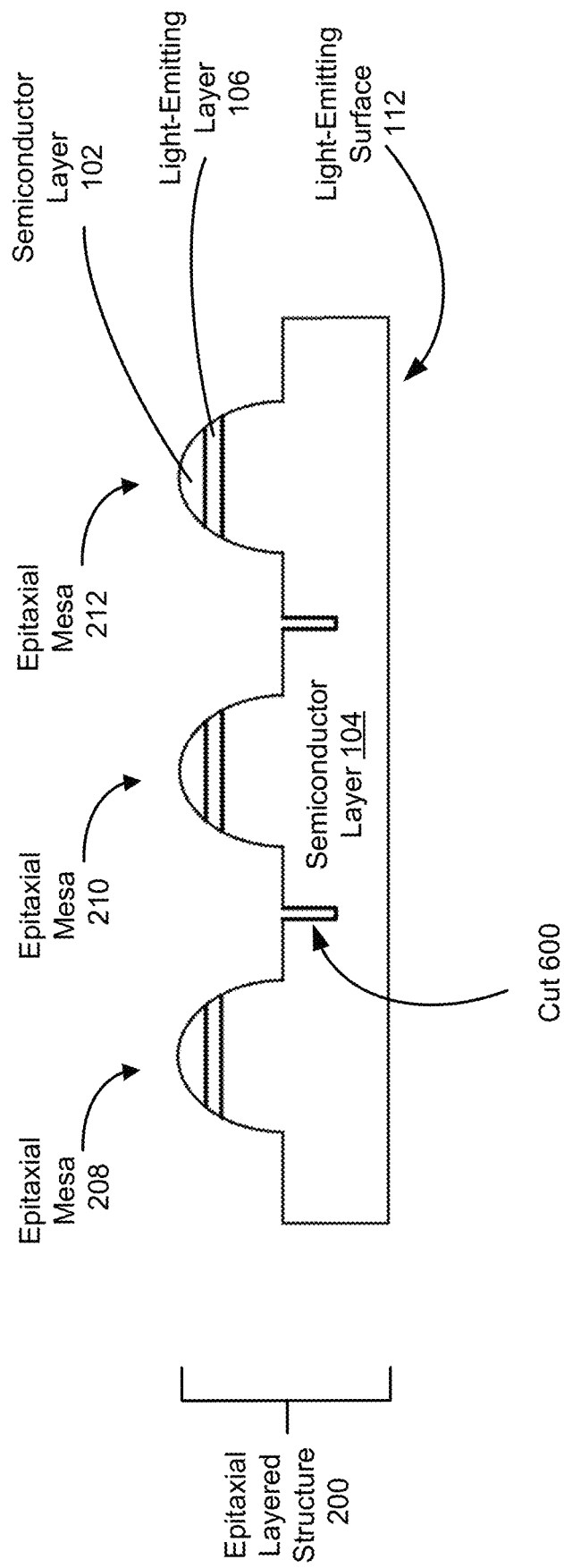
FIGS. 6A-C illustrate an example approach for separating semiconductor devices, in accordance with an embodiment.

FIG. 6A illustrates a cut 600 partway through the epitaxial layered structure 200. In the example of FIG. 6A, the cut 600 corresponds to a partial singulation of the epitaxial layered structure 200. The cut 600 may be made using any of a variety of techniques including, without limitation, laser dicing or dry etching. Making the cut 600 may be performed at any time relative to the process illustrated in FIGS. 2A-B. For example, the cut 600 may be made concurrently with the process illustrated in FIGS. 2A-B based on molded etch masks shaped like mesas sitting on rectangular bases.

Figure 6B:
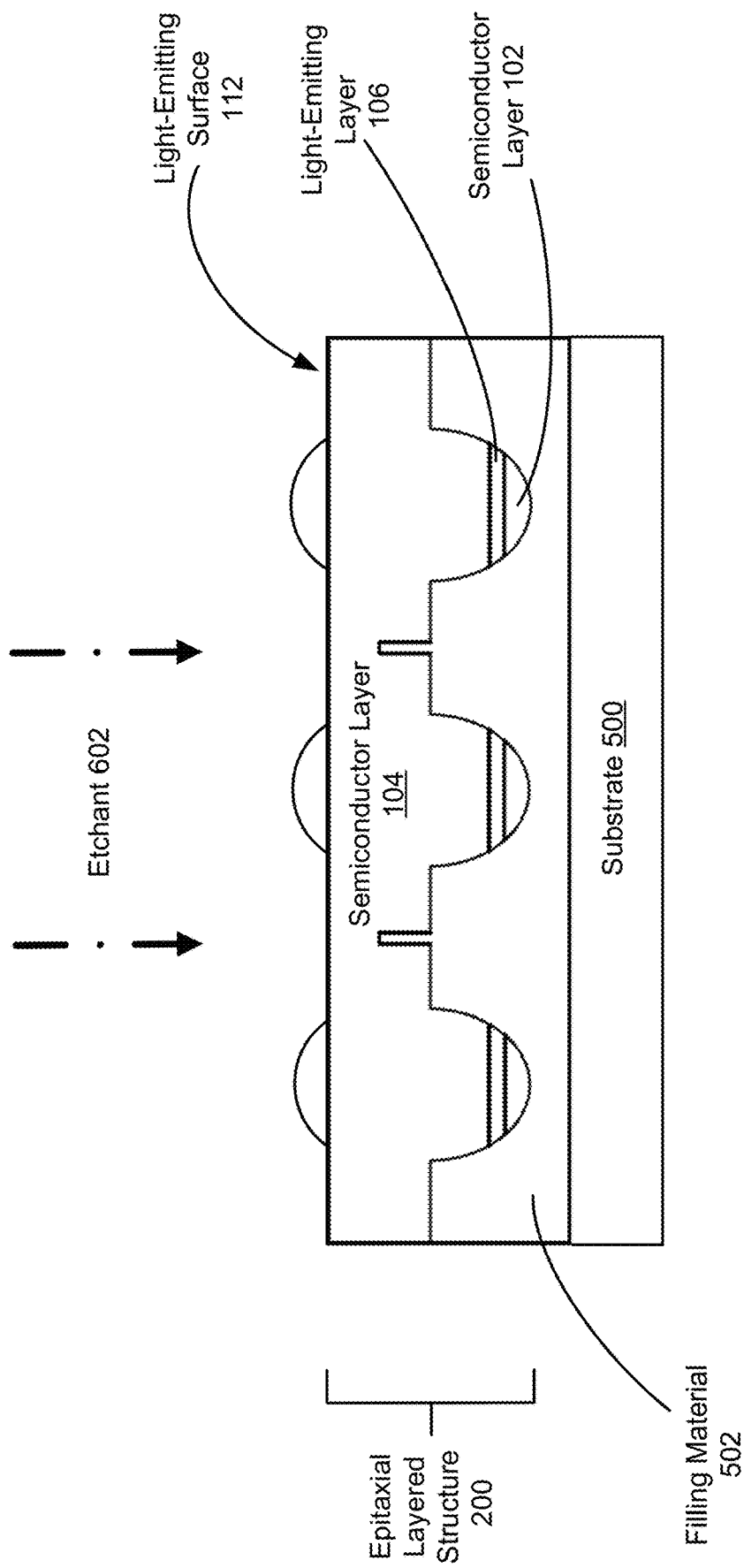

Referring to FIG. 6B, the epitaxial layered structure 200 of FIG. 6A may then be subjected to a process similar to that illustrate in FIGS. 5A-C. In particular, an etchant 602 may be used to etch optical elements on the light-emitting surface 112 of the epitaxial layered structure 200. For example, the etchant 602 may be a plasma that is accelerated toward the epitaxial layered structure 200. The etchant 602 may cause the epitaxial layered structure 200 to erode until the cut 600 is reached. Thus, the etching process can be used to finish cutting through the epitaxial layered structure 200, thereby dividing the epitaxial layered structure 200 into sets of one or more semiconductor devices, such as those illustrated in FIG. 6C.

Figure 6C:
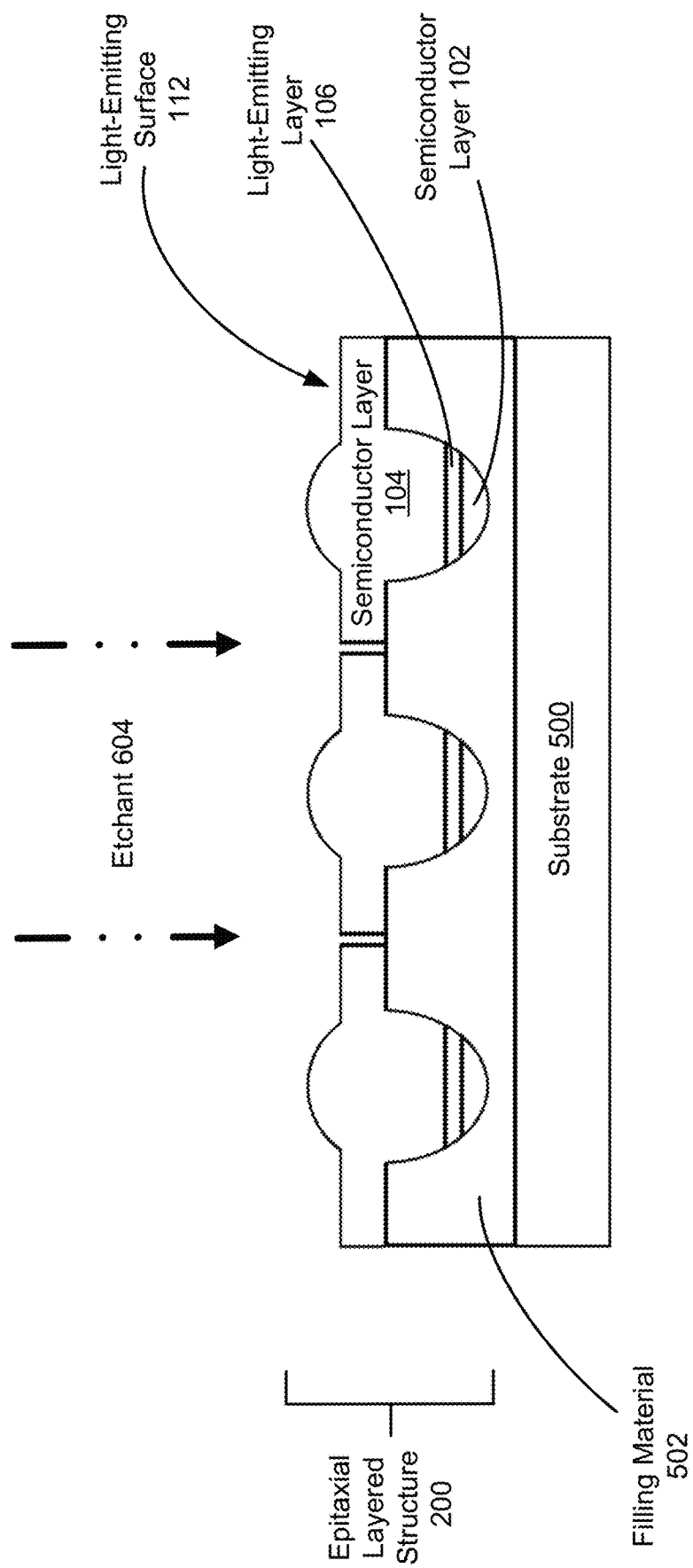

Referring to FIG. 6C, an etchant 604 may be directed between the sets of one or more semiconductor devices to remove some of the filling material 502. For example, the etchant 604 may be a plasma used in an RF dry-etching process to remove some of the filling material 502 between the sets of one or more semiconductor devices. Thereafter, each set of one or more semiconductor devices may be transported separately, for example, by using a pick-and-place technique.

Process Overview

Figure 7:
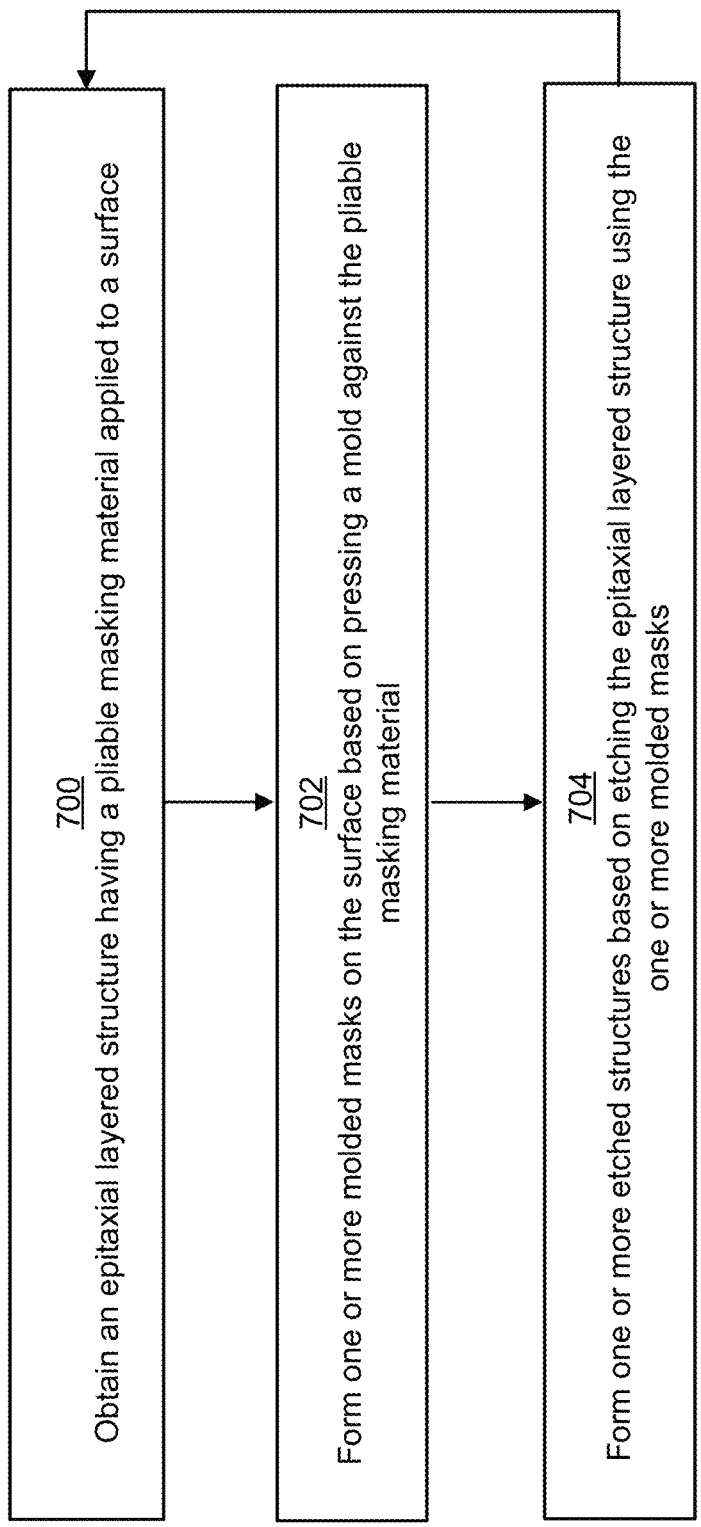
FIG. 7 is a flow diagram illustrating an example approach for fabricating semiconductor devices, in accordance with an embodiment.

FIG. 7 illustrates an example semiconductor device fabrication process. In some embodiments, the example process is performed at a station that fabricates LED components for collimating light.

At block 700, the station obtains an epitaxial layered structure that has a pliable masking material applied thereto. The pliable masking material may be applied to a light-emitting surface of the epitaxial layered structure and/or an opposite surface. In some embodiments, the pliable masking material is applied at a different station. For example, one or more other stations may have grown the epitaxial layered structure and deposited the pliable masking material on a surface of the epitaxial layered structure.

At block 702, the station causes a mold to be pressed against the pliable masking material, thereby forming one or more molded masks out of the pliable masking material. The mold may be used to form one or more epitaxial mesas. For example, the mold may comprise one or more mesa-shaped cavities which, when pressed against the pliable masking material, form one or more masks comprising a mesa shape. Additionally or alternatively, the mold may be used to form one or more optical elements. For example, the mold may comprise one or more lens-shaped cavities which, when pressed against the pliable masking material, form one or more masks comprising a lens shape.

At block 704, the station causes the epitaxial layered structure to be etched using the one or more masks molded at block 702. Thus, one or more etched structures are formed. The one or more etched structures may comprise an epitaxial mesa and/or an optical element. The epitaxial mesa may serve to collimate light within the epitaxial layered structure, and the optical element may serve to modify light transmitted through the light-emitting surface of the epitaxial layered structure. In some embodiments, block 704 proceeds to block 700 to repeat the example process of FIG. 7.

System Overview

Figure 8:
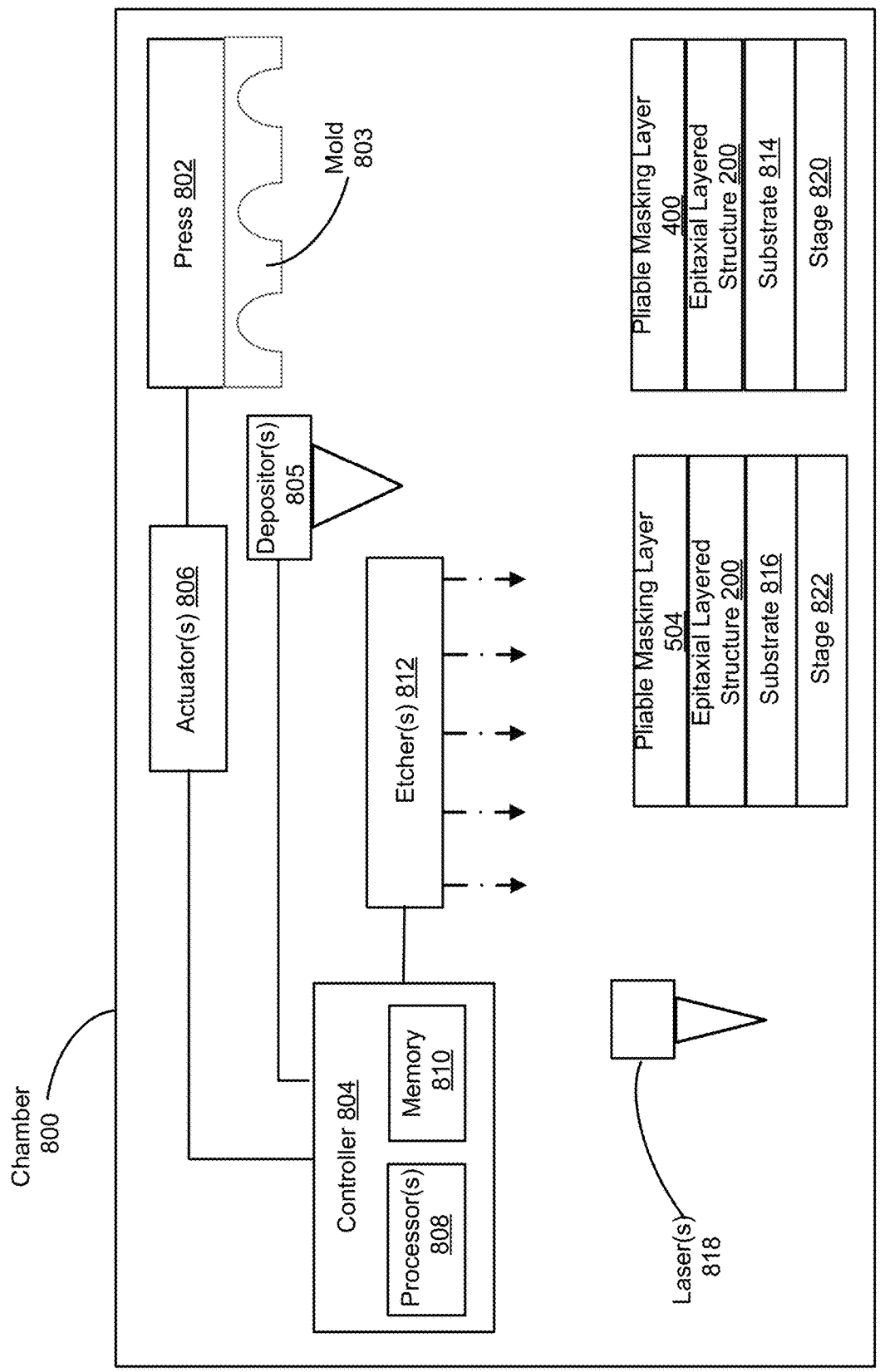
FIG. 8 illustrates an example system for fabricating semiconductor devices, in accordance with an embodiment.

FIG. 8 illustrates an example semiconductor device fabrication system. In some embodiments, the example system comprises a station that fabricates LED components for collimating light. The example system includes a chamber 800 that defines an interior environment for fabricating light-collimating LED components. The chamber 800 houses various system components including a press 802, a controller 804, depositor(s) 805, actuator(s) 806, etcher(s) 812, substrates 814 and 816, stages 820 and 822, and optional laser(s) 818. The chamber 800 may also house other system components not illustrated in FIG. 8. For example, the chamber 800 may also house a scanning electron microscope (SEM) in a high pressure atmosphere of water vapor.

The substrate 814 supports an epitaxial layered structure 200 having a pliable masking layer 400 deposited thereon. The depositor(s) 805 may be used to deposit the pliable masking layer 400 on a surface opposite to a light-emitting surface of the epitaxial layered structure 200. This enables the formation of epitaxial mesas.

The substrate 816 supports an epitaxial layered structure 200 having a pliable masking layer 504 deposited thereon. The depositor(s) 805 may be used to deposit the pliable masking layer 504 on a light-emitting surface of the epitaxial layered structure 200. This enables the formation of lenses or other optical elements.

The stages 820 and 822 hold the substrates 814 and 816, respectively. Each of the stages 820 and 822 may be movable in a variety of directions including, without limitation, up and down; left and right; and forward and back.

The press 802 holds a mold 803 for forming one or more masks on the epitaxial layered structure 200. As described above, the one or more masks are formed when the mold 803 is pressed against masking material. The mold 803 may comprise one or more cavities that each comprise a mesa shape for forming epitaxial mesas. Additionally or alternatively, the mold 803 may comprise one or more cavities that each comprise a desired shape for forming lenses or other optical elements.

The press 802 is operatively coupled to the actuator(s) 806. The actuator(s) 806 electromechanically control the movement of the press 802 based on instructions from the controller 804. The actuator(s) 806 may move the press 802 in a variety of directions including, without limitation, up and down; left and right; and forward and back. Examples of actuator(s) 806 include, without limitation, a rotating motor, a linear motor, and/or a hydraulic cylinder.

The controller 804 is coupled, via the actuator(s) 806, to the press 802 and controls the operations of the press 802. The controller 804 may include, among other components, a memory 810 and processor(s) 808. The memory 810 stores instructions for operating the press 802. The memory 810 may be implemented using any of a variety of volatile or non-volatile computer-readable storage media including, without limitation, SRAM, DRAM, and/or ROM. The processor(s) 808 execute the instructions stored in the memory 810 and send instructions toward the press 802. In some embodiments, the processor(s) 808 execute the example process illustrated in FIG. 7.

In the example of FIG. 8, the controller 804 is also coupled to the depositor(s) 805 and the etcher(s) 812. In some embodiments, the etcher(s) 812 comprise a dry etcher that forms one or more etched structures based on instructions received from the controller 804. In such embodiments, the etcher(s) 812 may include gas intake and gas out-take valves, ionizing plates, and any other standard dry etching components.

In some embodiments, the chamber 800 also houses optional laser(s) 818 for dicing, curing masks, causing semiconductor devices to fluoresce, and/or performing any other technique related to molded etch masks. In some embodiments, one or more of the optional laser(s) 818 are housed in the press 802 such that laser light can be transmitted through the mold 803 when the mold 803 is pressed against masking material.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method, comprising:
    obtaining an epitaxial layered structure having a first surface and a second surface opposite the first surface, wherein a first masking layer is applied to the first surface, and wherein the epitaxial layered structure comprises a first semiconductor layer, a second semiconductor layer, and a light-emitting layer between the first and second semiconductor layers;
    pressing a first mold against the first pliable masking layer and deforming the first masking layer, to form one or more first molded masks on the first surface;
    etching the epitaxial layered structure using the one or more first molded masks to form one or more epitaxial mesas configured to that collimate light within the epitaxial layered structure;
    applying a second masking layer to the second surface;
    pressing a second mold against the second masking layer and deforming the second masking layer, to form one or more second molded masks on the second surface; and
    etching the epitaxial layered structure using the one or more second molded masks, to form one or more optical structures configured to optically alter light transmitted through the second surface of the epitaxial layered structure.

2. The method of claim 1, further comprising:
    prior to pressing the second mold against the second masking layer, aligning the second mold such that at least one cavity of the second mold is aligned with at least one epitaxial mesa of the epitaxial layered structure.

3. The method of claim 2, wherein aligning the second mold comprises:
    irradiating the epitaxial layered structure with light within a particular wavelength range, thereby causing the at least one epitaxial mesa to fluoresce.

4. The method of claim 1, further comprising:
    prior to etching the epitaxial layered structure, cutting partway through the epitaxial layered structure such that etching the epitaxial layered structure finishes cutting through the epitaxial layered structure.

5. The method of claim 1, further comprising:
    prior to etching the epitaxial layered structure, curing the one or more second molded masks based on performing a thermal curing process or exposing the one or more second molded masks to light within a particular wavelength range through the second mold.

6. The method of claim 1, wherein the first mold comprises one or more cavities that are molded against one or more mesa-shaped structures.

7. The method of claim 1, wherein etching the epitaxial layered structure is performed using a dry etching technique.

8. The method of claim 1, wherein each of the one or more epitaxial mesas is a paraboloid having a truncated vertex.

9. The method of claim 1, wherein each of the one or more optical structures is a lens.

10. A non-transitory computer-readable storage medium storing processor-executable instructions for:
   obtaining an epitaxial layered structure having a first surface and a second surface opposite the first surface, wherein a first masking layer is applied to the first surface, and wherein the epitaxial layered structure comprises a first semiconductor layer, a second semiconductor layer, and a light-emitting layer between the first and second semiconductor layers;
   pressing a first mold against the first masking layer and deforming the first masking layer, to form one or more first molded masks on the first surface;
   etching the epitaxial layered structure using the one or more first molded masks to form one or more epitaxial mesas configured to collimate light within the epitaxial layered structure;
   applying a second masking layer to the second surface;
   pressing a second mold against the second masking layer and deforming the second masking layer, to form one or more second molded masks on the second surface; and
   etching the epitaxial layered structure using the one or more second molded masks, to form one or more optical structures configured to optically alter light transmitted through the second surface of the epitaxial layered structure.

11. The non-transitory computer-readable storage medium of claim 10, further storing processor-executable instructions for:
   prior to pressing the second mold against the second masking layer, aligning the second mold such that at least one cavity of the second mold is aligned with at least one epitaxial mesa of the epitaxial layered structure.

12. The non-transitory computer-readable storage medium of claim 11, wherein aligning the second mold comprises:
   irradiating the epitaxial layered structure with light within a particular wavelength range, thereby causing the at least one epitaxial mesa to fluoresce.

13. The non-transitory computer-readable storage medium of claim 10, further storing processor-executable instructions for:
   prior to etching the epitaxial layered structure, cutting partway through the epitaxial layered structure such that etching the epitaxial layered structure finishes cutting through the epitaxial layered structure.

14. The non-transitory computer-readable storage medium of claim 10, further storing processor-executable instructions for:
   prior to etching the epitaxial layered structure, curing the one or more second molded masks based on performing a thermal curing process or exposing the one or more second molded masks to light within a particular wavelength range through the second mold.

15. The non-transitory computer-readable storage medium of claim 10, wherein the first mold comprises one or more cavities that are molded against one or more mesa-shaped structures.

16. The non-transitory computer-readable storage medium of claim 10, wherein etching the epitaxial layered structure is performed using a dry etching technique.

17. The non-transitory computer-readable storage medium of claim 10, wherein each of the one or more epitaxial mesas is a paraboloid having a truncated vertex.

18. The non-transitory computer-readable storage medium of claim 10, wherein each of the one or more optical structures is a lens.

* * * * *